(12) United States Patent
Chang et al.

(10) Patent No.: US 11,227,774 B2
(45) Date of Patent: Jan. 18, 2022

(54) METHODS AND SYSTEMS FOR ETCHING SILICON CYANIDE (SICN) WITH MULTI-COLOR SELECTIVITY

(71) Applicant: Tokyo Electron Limited, Tokyo (JP)

(72) Inventors: Shihsheng Chang, Albany, NY (US); Andrew Metz, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/104,611

(22) Filed: Nov. 25, 2020

(65) Prior Publication Data

US 2021/0172062 A1 Jun. 10, 2021

Related U.S. Application Data

(60) Provisional application No. 62/944,067, filed on Dec. 5, 2019.

(51) Int. Cl.
| | |
|---|---|
| *H01L 21/311* | (2006.01) |
| *C23C 16/455* | (2006.01) |
| *H01L 21/3065* | (2006.01) |
| *H01L 21/033* | (2006.01) |
| *H01L 21/308* | (2006.01) |
| *H01L 21/3213* | (2006.01) |

(52) U.S. Cl.
CPC .. *H01L 21/31116* (2013.01); *C23C 16/45502* (2013.01); *C23C 16/45557* (2013.01); *H01L 21/0337* (2013.01); *H01L 21/3065* (2013.01); *H01L 21/3088* (2013.01); *H01L 21/31138* (2013.01); *H01L 21/31144* (2013.01); *H01L 21/32137* (2013.01)

(58) Field of Classification Search
None
See application file for complete search history.

(56) References Cited

U.S. PATENT DOCUMENTS

| | | | |
|---|---|---|---|
| 6,635,185 B2* | 10/2003 | Demmin | H01L 21/30604 216/64 |
| 2015/0048049 A1* | 2/2015 | Nishimura | B81C 1/00031 216/37 |
| 2016/0307732 A1* | 10/2016 | Tahara | H01J 37/32449 |
| 2018/0102257 A1* | 4/2018 | Nagabhirava | H01L 21/31116 |
| 2018/0151363 A1* | 5/2018 | Su | H01L 21/0335 |

* cited by examiner

Primary Examiner — Jiong-Ping Lu

(57) ABSTRACT

Methods and systems for etching SiCN with mutli-color selectivity may include receiving the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer. Such a method may also include forming a patterned recess in the multi-line layer to expose at least a first component of the multi-line layer and a second component of the multi-line layer. An embodiment of a method many also include etching the first component with a non-corrosive etch process that is selective to the second component.

18 Claims, 6 Drawing Sheets

| | NF3, 20mt, 100/300W 15O2,15" | NF3, 100mt, 100/300W 30O2,15" | NF3, 150mt, 100/100W 60O2,50" | NF3, 250mt, 100/100W 60O2,40" |
|---|---|---|---|---|
| | | Higher pressure, lower LF, higher O2 => sel. Up, more isotropic | | |
| D06 | 17.2nm / 49.6nm; Y-cut 46.2nm | 45.5nm / 9.24nm / 39.6nm; Y-cut 8.60nm / 43.6nm | 3.96nm / 8.58nm / 45.5nm; Tilt Y-cut 20.5nm / 43.6nm | 5.28nm / 3.30nm / 51.5nm; Tilt Y-cut 21.2nm / 46.3nm |
| SiCN loss | ~49.6nm | >40nm | ~45.5nm | ~51.5nm |
| SiN loss | ~17.2nm | ~9.4nm | ~8.58nm | ~5.28nm |
| SWS loss | ~17.2nm | ~9.4nm | ~3.96nm | ~3.3nm |
| D16 | 42.3nm / 16.5nm / 19.8nm; Y-cut 48.2nm | 11.9nm / 15.9nm / 53.5nm / 40.3nm | 3.96nm / 8.58nm / 33.0nm | |
| SiCN loss | ~42.3nm | ~40.3nm | ~33nm | |
| SiN loss | ~19.8nm | ~15.9nm | ~8.58nm | |
| SWS loss | ~16.5nm | ~11.9nm | ~3.96nm | |
| Sel. | | | | |

FIG. 6

| | NF3, 20mt, 100/300W 15O2,15" | NF3, 100mt, 100/300W 30O2,15" | NF3, 150mt, 100/100W 60O2,50" | NF3, 250mt, 100/100W 60O2,40" |
|---|---|---|---|---|
| | | Higher pressure, lower LF, higher O2 => sel. Up, more isotropic → | | |
| D06 | 17.2nm / 49.6nm; Y-cut 46.2nm | 45.5nm / 9.24nm / 39.6nm; Y-cut 8.60nm / 43.6nm | 3.96nm / 8.58nm / 45.5nm; Tilt Y-cut 20.5nm / 43.6nm | 5.28nm / 3.30nm / 51.5nm; Tilt Y-cut 21.2nm / 46.3nm |
| SiCN loss | ~49.6nm | >40nm | ~45.5nm | ~51.5nm |
| SiN loss | ~17.2nm | | ~8.58nm | ~5.28nm |
| SWS loss | ~17.2nm | ~9.4nm | ~3.96nm | ~3.3nm |
| D16 | 16.5nm / 19.8nm / 42.3nm; Y-cut 48.2nm | 11.9nm / 15.9nm / 53.5nm / 40.3nm | 3.96nm / 8.58nm / 33.0nm | |
| SiCN loss | ~42.3nm | ~40.3nm | ~33nm | |
| SiN loss | ~19.8nm | ~15.9nm | ~8.58nm | |
| SWS loss | ~16.5nm | ~11.9nm | ~3.96nm | |
| Sel. | | | | |

FIG. 7

METHODS AND SYSTEMS FOR ETCHING SILICON CYANIDE (SICN) WITH MULTI-COLOR SELECTIVITY

CROSS REFERENCE TO RELATED PATENTS AND APPLICATIONS

This application claims priority to and the benefit of the filing date of U.S. Provisional Patent Application No. 62/944,067, filed Dec. 5, 2019, which application is incorporated herein by reference in its entirety.

BACKGROUND OF THE INVENTION

Field of Invention

The present invention relates to systems and methods for substrate processing, and more particularly to a method and system for etching silicon cyanide (SiCN) with multi-color selectivity.

Description of Related Art

A multi-color stack may be used for self-aligned gate contact (SAGC) processes. As used herein, the term multi-color stack refers to a horizontal layer with multiple vertical components. A multi-color stack may include two vertical components, three vertical components, four vertical components, five vertical components, or more than five vertical components. Another way of defining a multi-color stack is a multi-material layer falling along a latitudinal axis with respect to a multi-layer stack, the multi-material layer comprising a plurality of components, each component being arranged along a more longitudinal than latitudinal axis with respect to the multi-layer stack. One such multi-color stack may include a silicon cyanide (SiCN) component, a silicon oxicarbide (SiOC) component, and a silicon nitride ($Si_3N_4$) component. Multi-color stacks may be used for gate spacer-core-contact formation processes. One of ordinary skill will recognize alternative multi-color stack structures, comprising alternative components of various chemical makeup. The described embodiments may be used with such alternatives without limitation.

While the methods of forming a multi-color stacks of various composition are known, methods of processing SiCN components of a multi-color stack suffer from low selectivity to other components of the multi-color stack. Consequently, etch processes used for SiCN components of a multi-color stack are costly or problematic from a yield or throughput perspective. One reason for the cost is that known methods use corrosive gas-based chemistries. Improvement is needed in resulting etch structure profiles, particularly where the critical dimension (CD) of formations approaches the 40 nm regime.

Some processes for etching SiCN components of a multi-color stack are known, including processes that use nitrogen trifluoride ($NF_3$) at an etch gas component; however such processes are typically corrosive because of additional gases mixed with the $NF_3$. For example, one corrosive etch gas comprises a mixture ammonia ($HF_3$) and $NF_3$ at a mix rate ratio greater than 6%. Additional mix gases such as Argon (Ar) may be included in such a mixture at varying rates. Such processes may be too corrosive for producing feature structure profiles that are suitable for some applications, particularly as the feature CD reaches the 40 nm regime.

Often the composition of the multi-color stack contributes to corrosion issues. For example, some multi-color stacks include a SiCN component and a SiCOH component. The corrosive etch processes that include ammonia in the etch gas mixture may not be sufficiently selective to the SiCOH component.

SUMMARY OF THE INVENTION

Methods and systems for etching SiCN with mutli-color selectivity are described. In an embodiment, a method may include receiving the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer. Such a method may also include forming a patterned recess in the multi-line layer to expose at least a first component of the multi-line layer and a second component of the multi-line layer, wherein at least one of the first component and the second component comprises a low-k material. An embodiment of a method many also include etching the first component with a non-corrosive etch process that is selective to the second component.

Embodiments of systems for etching SiCN with multi-color selectivity are also described. In an embodiment, a system may include a processing chamber configured to receive the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer. Additionally, such a system may include a controller coupled to the processing chamber and configured to control operations of the processing chamber to cause the processing chamber to: form a patterned recess in the multi-line layer to expose at least a first component of the multi-line layer and a second component of the multi-line layer, wherein at least one of the first component and the second component comprises a low-k material; and etch the first component with a non-corrosive etch process that is selective to the second component, wherein the non-corrosive etch process comprises etching the first component in an environment comprising a gaseous mixture of nitrogen trifluoride (NF3) and at least one diluent component.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

FIG. 6 is a chart showing experimental results of a plurality of embodiments of processes for selectively etching a region of a multi-color layer.

FIG. 7 is a chart showing experimental results of a plurality of embodiments of processes for selectively etching a region of a multi-color layer.

DETAILED DESCRIPTION OF EMBODIMENTS OF THE INVENTION

Figure 1:
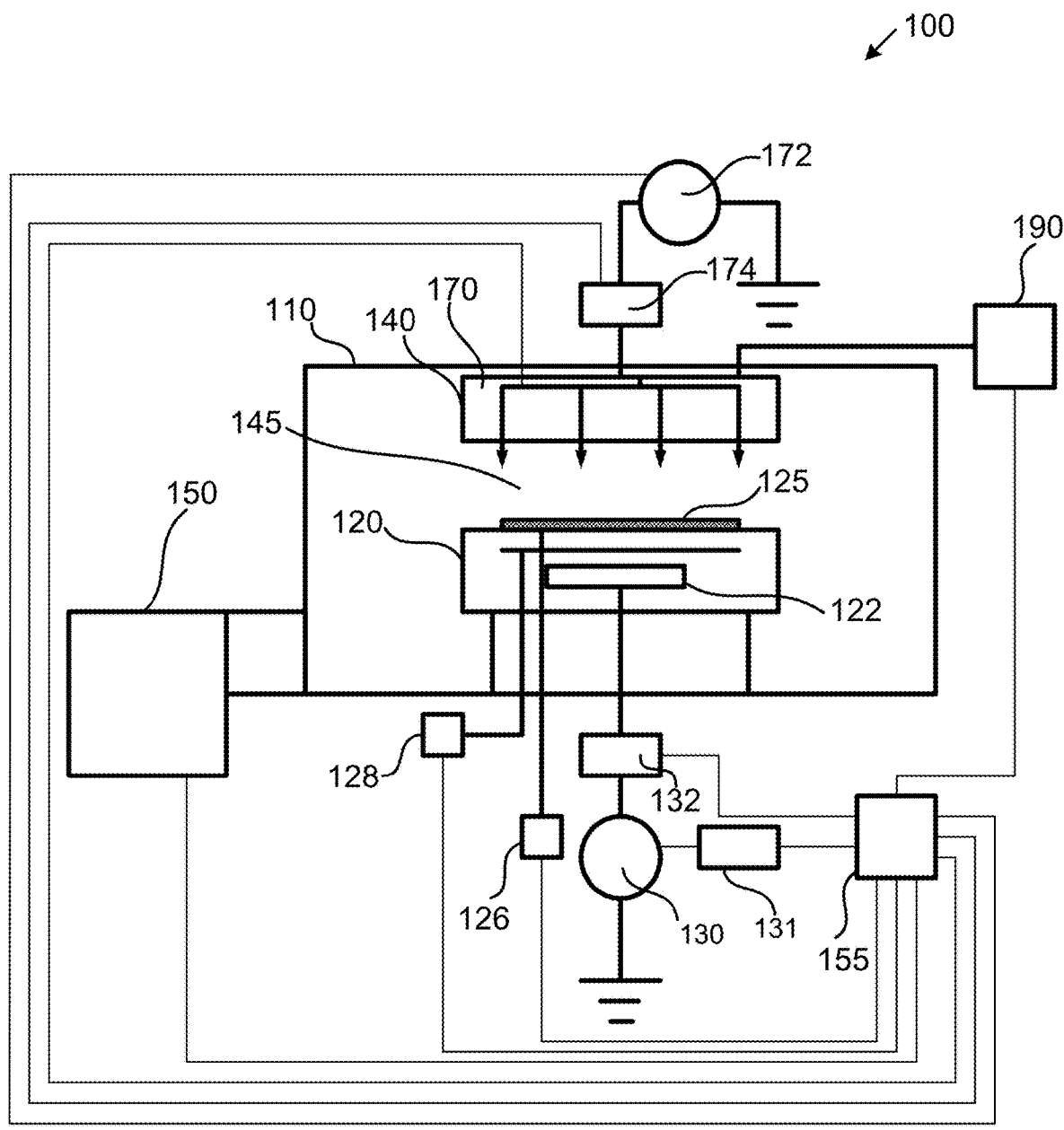
FIG. 1 illustrates one embodiment of a reactive ion etch (RIE) tool for semiconductor processing.

Methods and systems for etching SiCN with mutli-color selectivity. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. For example, one of ordinary skill will recognize that, with only minor modification, the present embodiments may be adapted for selective etch of other components of a multi-color layer.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Embodiments of the disclosed system and method may be used to etch silicon cyanide (SiCN) with non-corrosive chemistry (such as nitrogen trifluoride) selectively to other materials in a multi-color test vehicle in a plasma etch tool. High selectivity to materials such as silicon, silicon oxide, silicon nitride and silicon oxycarbide is achieved and it was shown it is a isotropic etch process.

Referring now to the drawings, where like reference numerals designate identical or corresponding parts throughout the several views.

FIG. 1 is an embodiment of a system 100 for etching SiCN with multi-color selectivity. In a further embodiment, the system may be configured to for etching SiCN with multi-color selectivity as described with reference to FIG. 2 and the examples of FIGS. 3A-5B. An etch and plasma-assisted deposition system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Examples of processing parameters that may be used in the system 100 are described in Table 1 below. Although the parameters described in Table 1 have been used with certain degrees of success for various embodiments of the described processes, one of ordinary skill will recognize that ranges of parameters may be used, and that various parameter levels may be optimal for various applications of the described embodiments. Variables may include material compositions, layer thicknesses, etch depths, selectivity requirements, etc.

Figure 2:
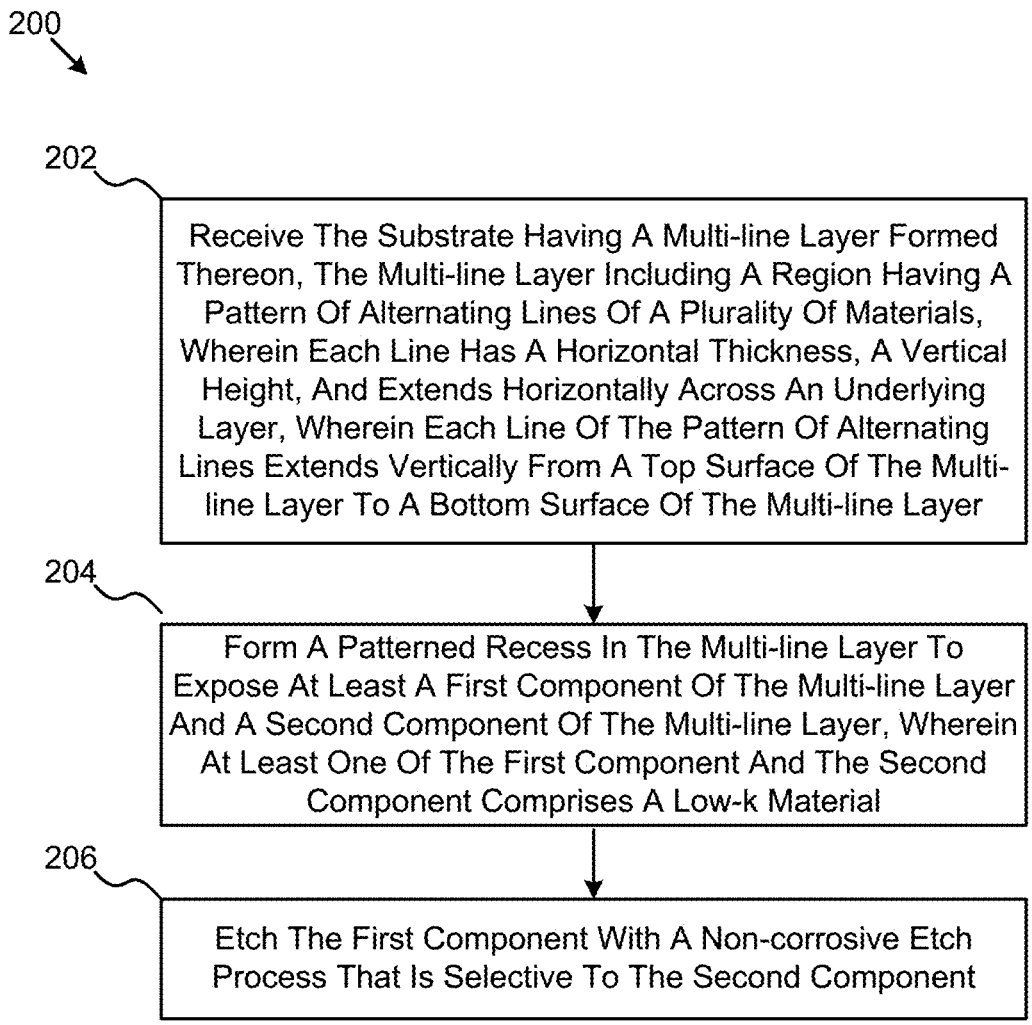
FIG. 2 illustrates one embodiment of a method for etching SiCN with mutli-color selectivity.

FIG. 2 illustrates one embodiment of a method 200 for etching SiCN with multi-color selectivity. In an embodiment, a method 200 may include receiving the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer as described in block 202. Such a method 200 may also include forming a patterned recess in the multi-line layer to expose at least a first component of the multi-line layer and a second component of the multi-line layer as shown at block 204. In such an embodiment, wherein at least one of the first component and the second component comprises a low-k material. At block 206, the method 200 many also include etching the first component with a non-corrosive etch process that is selective to the second component.

FIGS. 3A-3D illustrate processing steps for forming a multi-line layer 320 on a semiconductor workpiece. A multi-line layer 320 may also be referred to as a multi-color layer, and both terms are used interchangeably herein. A multi-line layer 320 may include a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer 320 to a bottom surface of the multi-line layer. For example, in one embodiment, a multi-line layer 320 shown in FIG. 3D may include a pattern of alternating lines of SiOC, $Si_3N_4$, and SiCN materials.

In an embodiment, the process of forming the multi-line layer 320 includes forming a stack of material layers on a bulk silicon substrate (not shown). For example, the stack of layers may include a low-k layer 302, a tetraethoxysaline (TEOS) layer 304, a metal hardmask (MHM) layer 306, a core dielectric layer 308, a planarization layer 310, and an anti-reflective coating (ARC) layer 312. In one embodiment a planarization layer 310 may include a spin-on material, such as spin-on-carbon (SOC) or spin-on-glass (SOG). In an embodiment a patterned layer 314 may be formed on the ARC layer 312. In one embodiment, the patterned layer 314 may be a polymer photoresist layer. In an embodiment, the core dielectric layer 308 comprises a SiCN material.

Figure 3A:
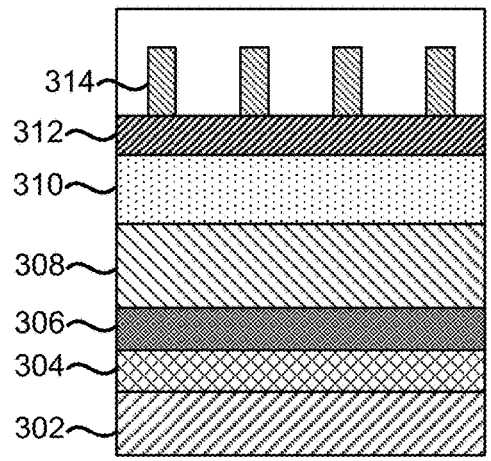
FIG. 3A is a cross-section diagram illustrating one embodiment of a workpiece at an embodiment of a phase of a process for forming a multi-color layer.
Figure 3B:
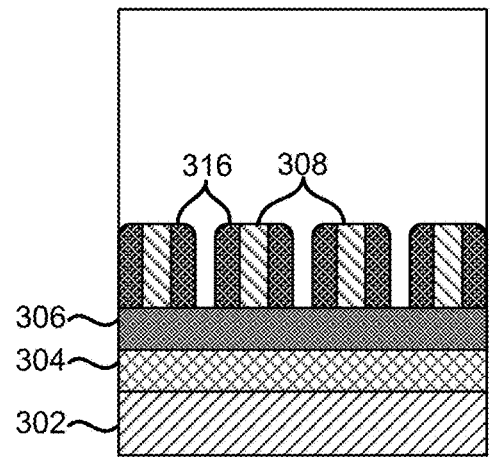
FIG. 3B is a cross-section diagram illustrating one embodiment of a workpiece at an embodiment of a phase of a process for forming a multi-color layer.

At FIG. 3B, the software stack may be etched to leave a patterned layer of the core dielectric layer 308 on the MHM layer 306. In a further processing step, spacer lines 316 may be formed adjacent the core dielectric lines. In an embodiment, the spacer lines 316 may comprise a SiOC material.

Figure 3C:
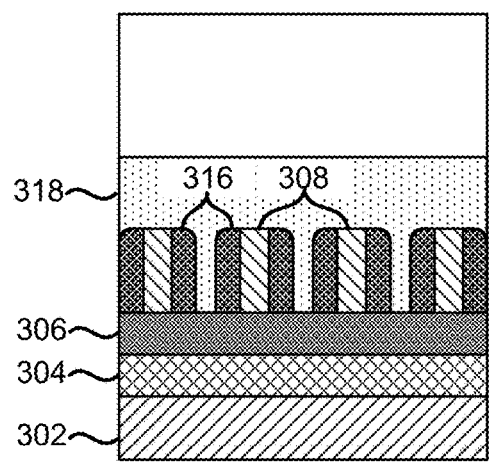
FIG. 3C is a cross-section diagram illustrating one embodiment of a workpiece at an embodiment of a phase of a process for forming a multi-color layer.
Figure 3D:
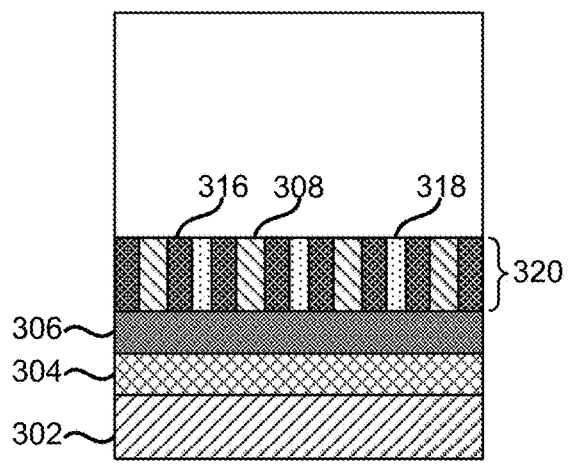
FIG. 3D is a cross-section diagram illustrating one embodiment of a workpiece at an embodiment of a phase of a process for forming a multi-color layer.

At FIG. 3C, spaces between spacer lines 316 may be filled with a planarization layer 318 to form filled lines between the spacer lines 316. In an embodiment, the planarization layer 318 may comprise $Si_3N_4$. In such an embodiment, the planarization layer 318 may be removed to an upper surface of the multi-line layer 320 as shown in FIG. 3D. In one embodiment, the planarization layer 318 may be removed using a chemical mechanical polish (CMP) technique. One of ordinary skill will recognize alternative methods for removing portions of the planarization layer 318.

In certain embodiments, the process used for forming a multi-line layer 320 may be included with the present embodiments. Alternatively, a workpiece with the multi-line layer 320 already formed thereon may be provided as an input to the process of FIG. 4A-4B.

Figure 4A:
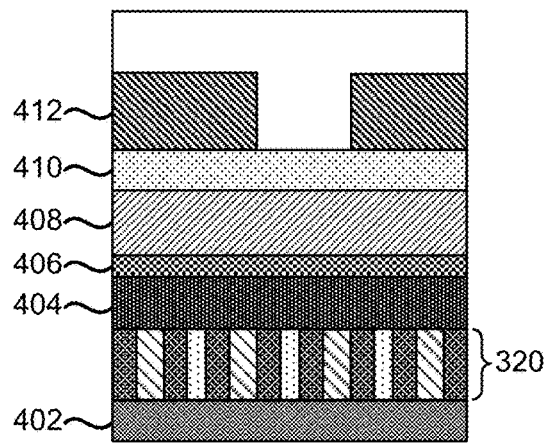
FIG. 4A is a cross-section diagram illustrating one embodiment of a workpiece at an embodiment of a phase of a process for forming an etch via to a multi-color layer.
Figure 4B:
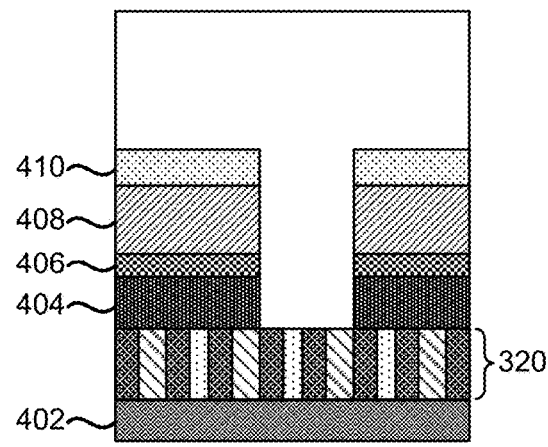
FIG. 4B is a cross-section diagram illustrating one embodiment of a workpiece at an embodiment of a phase of a process for forming an etch via to a multi-color layer.

In the process of FIG. 4A-4B, the multi-line layer 320 may be formed on a substrate 402. Although the substrate 402 may include the layers described in FIG. 3A-3D, various alternative embodiments of substrates 402 may be used without departure from the scope of the present embodiments. In an embodiment, an insulator layer 404 may be formed on the multi-line layer 320. In one embodiment, the insulator layer 404 may include silicon dioxide ($SiO_2$). In one such embodiment, approximately the insulator layer 404 may have a thickness of approximately 50 nm. Additionally, a metal hardmask layer 406 may be formed on the insulator layer 404. In an embodiment, the metal hardmask layer 406 may comprise a TiN material. In one embodiment, the metal hardmask layer 406 may have a thickness of approximately 20 nm. In a further embodiment, a first spin-on layer 408 and a second spin-on layer 410 layer may be formed on the metal nitride layer 406. In various embodiments, the first spin-on layer 408 and the second spin-on layer 410 may be organic spin-on materials. In one such embodiment, the first spin-on layer 408 may be a spin-on carbon (SOC) material, and the second spin-on layer 410 may be a spin-on glass (SOG) material. In one embodiment, the thickness of the first spin-on layer 408 may be approximately 100 nm. In an embodiment, a patterned layer 412 may be formed on one of the first spin-on layer 408 or the second spin-on layer 410. The patterned layer 412 may include a polymer photoresist material patterned according to various photolithography techniques.

Figure 5A:
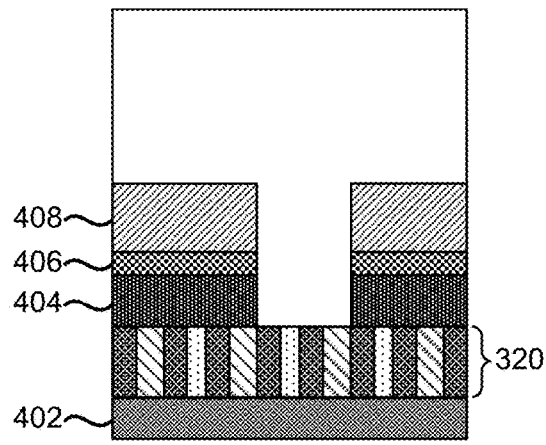
FIG. 5A is a cross-section diagram illustrating one embodiment of a workpiece at an embodiment of a phase of a process for selectively etching a multi-color layer.
Figure 5B:
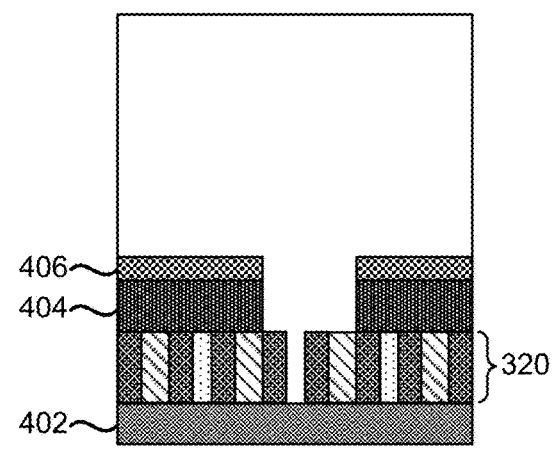
FIG. 5B is a cross-section diagram illustrating one embodiment of a workpiece at an embodiment of a phase of a process for selectively etching a multi-color layer.

FIG. 5B illustrates a result of an etch process performed on the workpiece to expose a portion of the multi-line layer 320 as defined by the pattern in the patterned layer 412. In an embodiment, the patterned layer 412 may be at least partially removed during the etch process. The width of the trench formed may be defined, at least in part, by the width of a feature in the patterned layer. In one embodiment, the trench may have a critical dimension (CD) of approximately 40 nm.

In certain embodiments, the process used for forming the trench to expose one or more portions of the multi-line layer 320 may be included with the present embodiments. Alternatively, a workpiece with the multi-line layer 320 already exposed may be provided as an input to the process of FIG. 5A-5B.

In an embodiment, a processing flow may include receiving a workpiece as shown in FIG. 5A. The workpiece may include a multi-line layer 320 having one or more layers formed thereon. For example, the layers may include an insulator layer 404, a metal hardmask layer 406, and a first spin-on layer 408. In one embodiment, a via may be formed in the layers formed on the multi-line layer 320 to expose at least a portion of the multi-line layer 320.

At the step illustrated in FIG. 5B, a portion of the multi-line layer 320 may be removed using an etch process. In an embodiment, the etch process is performed using etch parameters that are selective to materials in the mutli-line layer 320 that are not to be etched. In a specific embodiment, a portion of the planarization layer material 318 in the multi-line layer 320 may be removed using a process that is selective to the material of the core dielectric layer 308 and the spacers 316. In a more specific embodiment, portions of the multi-line layer 320 comprising SiCN material may be removed using a process that is selective to both SiOC and $Si_3N_4$, thereby leaving those material remaining in the multi-line layer 320 despite portions of those materials being exposed to the etch process. As used herein, the term "multi-color selectivity" means a process that etches at least one type of material in a multi-line layer 320, but not all types of material in the multi-line layer 320.

In an embodiment, the material to be etched is silicon cyanide. In a further embodiment, the material that is not to be etched in the selective etch stage includes SiOC. In an embodiment, the material that is not to be etched in the selective etch stage includes $Si_3N_4$. Indeed, in some embodiments, neither SiOC nor $Si_3N_4$ is to be etched during the selective etch phase.

In one embodiment, the selective etch process is performed using a reactive ion etch (RIE) technique. An embodiment of a system that may be used for performing the selective etch process is illustrated in FIG. 1. The selective etch process may be carried out using one or more non-corrosive etch gas constituents. In one embodiment, the non-corrosive etch gas comprises nitrogen trifluoride (NF3). FIGS. 6 and 7 illustrate examples of experimental tests performed to determine suitable processing parameters.

In one embodiment, the NF3 gas may be introduced to the processing chamber at a flow rate in a range of 10 to 50 sccm. In an embodiment, the non-corrosive etch gas may include an oxygen component. The oxygen component may be introduced into the processing chamber at a flow rate in a range of 20 to 80 sccm. In an embodiment, the non-corrosive etch gas may include an argon component. The argon component may be introduced into the processing chamber at a flow rate in a range of 500 to 700 sccm.

In an embodiment, temperature, pressure, RF power, and processing time may be further controlled to meet processing objectives as shown in FIGS. 6 and 7. In one embodiment, an etch chamber pressure is in a range of 150 mTorr to 300 mTorr to produce suitable results as shown in FIG. 6. In an embodiment, a high frequency power may be applied in the chamber at a power level in a range of 80 to 120 W. A low frequency power may be applied in the chamber at a power level in a range of 80 to 120 W. The processing time may be in a range of 1 to 90 seconds.

Although specific ranges of processing parameters have been described herein, one of ordinary skill will recognize that alternative ranges of processing parameters may be used without departure from the scope of the present invention, and that the processing parameters may be variable according to the selected materials, required degree of selectivity, CD of the etched components, depth of etch, and the like.

For example, FIG. 6 illustrates results of tests performed at varying processing parameters, such as variable pressure and power levels. Also, the flow rate of O2 was varied in the experiments of FIGS. 6 and 7. The results show greater selectivity and more isotropic etches with increased pressure. Also the results show greater selectivity and more isotropic etches with lower Low Frequency (LF) power levels. Additionally the results show greater selectivity and more isotropic etches with higher O2 flow rates. One of ordinary skill will recognize that the pressure, power level, and O2 flow rates may be varied according to system performance characteristics and target processing results.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for processing a substrate, comprising:
   receiving the substrate having a multi-line layer formed thereon, the multi-line layer including a region having a pattern of alternating lines of a plurality of materials, wherein each line has a horizontal thickness, a vertical height, and extends horizontally across an underlying layer, wherein each line of the pattern of alternating lines extends vertically from a top surface of the multi-line layer to a bottom surface of the multi-line layer;
   forming a patterned recess in the multi-line layer to expose at least a first component of the multi-line layer and a second component of the multi-line layer, wherein at least one of the first component and the second component comprises a low-k material and wherein the first component is a silicon carbon nitride (SiCN) material; and
   etching the first component with an etch process that is selective to the second component.

2. The method of claim 1, wherein the etch process is a reactive ion etch process using an etch gas.

3. The method of claim 2, wherein the etch gas comprises nitrogen trifluoride (NF3).

4. The method of claim 3, further comprising supplying NF3 gas to a processing chamber at a flow rate in a range of 10 to 50 sccm.

5. The method of claim 3, wherein the etch gas comprises an oxygen component.

6. The method of claim 5, further comprising supplying oxygen to a processing chamber at a flow rate in a range of 20 to 80 sccm.

7. The method of claim 3, wherein the etch gas comprises an argon component.

8. The method of claim 7, further comprising supplying argon to a processing chamber at a flow rate in a range of 500 to 700 sccm.

9. The method of claim 1, wherein the second component comprises SiOC.

10. The method of claim 1, wherein the second component comprises Si3N4.

11. The method of claim 1, wherein the substrate further comprises an insulator layer formed on the multi-line layer.

12. The method of claim 11, wherein the substrate further comprises one or more patterned layers formed over the insulator layer.

13. The method of claim 12, further comprising patterning the insulator layer in a region exposed by the one or more patterned layers.

14. The method of claim 13, further comprising removing the first component of the multi-line layer in a region exposed by the patterned insulator layer.

15. The method of claim 1, wherein an etch chamber pressure is in a range of 150 mTorr to 300 mTorr.

16. The method of claim 1, wherein a power may be applied in the chamber at a power level in a range of 80 to 120 W.

17. The method of claim 1, wherein a power may be applied in the chamber at a power level in a range of 80 to 120 W.

18. The method of claim 1, wherein a processing duration is in a range of 1 to 90 seconds.

* * * * *